United States Patent
Nishio et al.

(10) Patent No.: US 7,508,045 B2
(45) Date of Patent: Mar. 24, 2009

(54) SIC SCHOTTKY BARRIER SEMICONDUCTOR DEVICE

(75) Inventors: Johji Nishio, Machida (JP); Takuma Suzuki, Kawasaki (JP); Chiharu Ota, Tokyo (JP); Takashi Shinohe, Yokosuka (JP)

(73) Assignee: Kabushiki Kaisha Toshiba, Minanto-Ku, Tokyo (JP)

(*) Notice: Subject to any disclaimer, the term of this patent is extended or adjusted under 35 U.S.C. 154(b) by 66 days.

(21) Appl. No.: 11/827,553

(22) Filed: Jul. 12, 2007

(65) Prior Publication Data
US 2008/0169475 A1    Jul. 17, 2008

(30) Foreign Application Priority Data
Jan. 11, 2007    (JP) .............................. 2007-003581

(51) Int. Cl.
*H01L 29/24* (2006.01)
(52) U.S. Cl. .................. 257/452; 257/77; 257/453; 257/471; 257/E29.104
(58) Field of Classification Search .............. 257/73, 257/77, 452, 453, 471, E29.104

See application file for complete search history.

(56) References Cited

FOREIGN PATENT DOCUMENTS

| JP | 59-35183 | 8/1984 |
|----|----------|--------|
| JP | 2001-85704 | 3/2001 |

*Primary Examiner*—Evan Pert
*Assistant Examiner*—Tan N Tran
(74) *Attorney, Agent, or Firm*—Ohlandt, Greeley, Ruggiero & Perle, L.L.P.

(57) ABSTRACT

A semiconductor device includes a first-conductivity-type SiC substrate, a first-conductivity-type SiC semiconductor layer formed on the substrate, whose impurity concentration is lower than that of the substrate, a first electrode formed on the semiconductor layer and forming a Schottky junction with the semiconductor layer, a barrier height of the Schottky junction being 1 eV or less, plural second-conductivity-type junction barriers formed to contact the first electrode and each having a depth $d_1$ from an upper surface of the semiconductor layer, a width w, and a space s between adjacent ones of the junction barriers, a second-conductivity-type edge termination region formed outside the junction barriers to contact the first electrode and having a depth $d_2$ from the upper surface of the semiconductor layer, and a second electrode formed on the second surface of the substrate, wherein following relations are satisfied $d_1/d_2 \geq 1$, $s/d_1 \leq 0.6$, and $s/(w+s) \leq 0.33$.

19 Claims, 4 Drawing Sheets

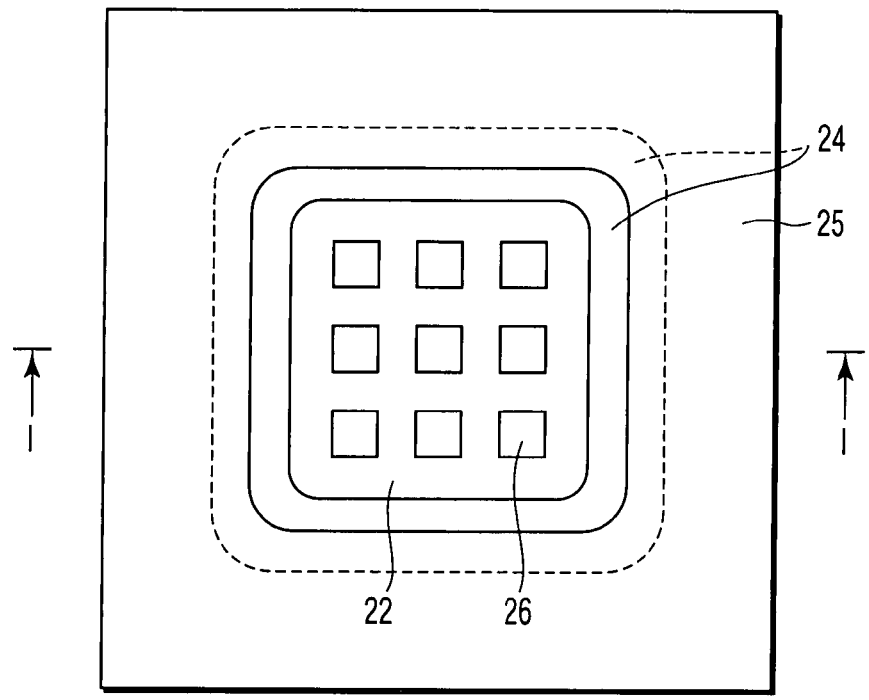
F I G. 3
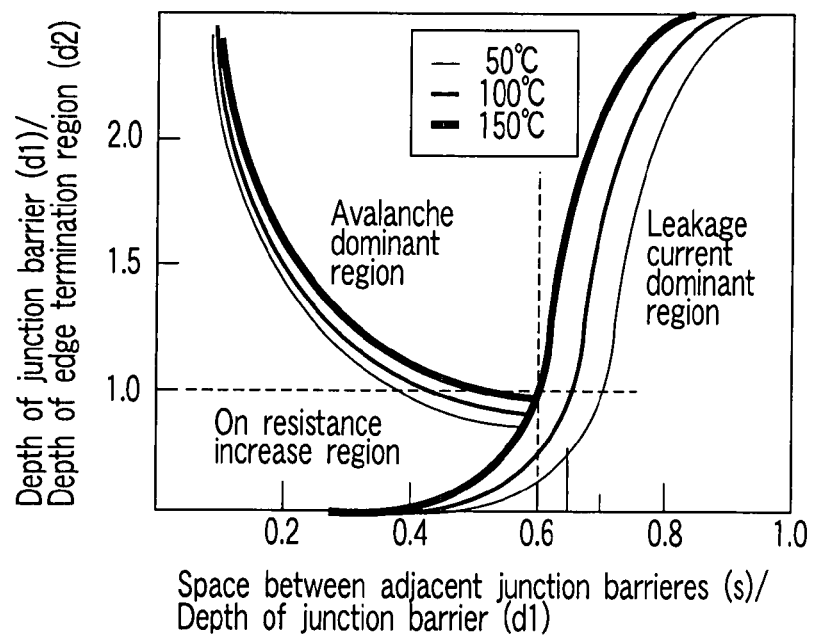
F I G. 4

SIC SCHOTTKY BARRIER SEMICONDUCTOR DEVICE

CROSS-REFERENCE TO RELATED APPLICATIONS

This application is based upon and claims the benefit of priority from prior Japanese Patent Application No. 2007-003581, filed Jan. 11, 2007, the entire contents of which are incorporated herein by reference.

BACKGROUND OF THE INVENTION

1. Field of the Invention

The present invention relates to a Schottky barrier semiconductor device provided with electrode layers forming Schottky barriers in an SiC semiconductor layer.

2. Description of the Related Art

An SiC Schottky barrier diode is used in, for example, a high-frequency circuit owing to its switching characteristics of enabling high-speed operation and a relatively small forward loss. In a conventional SiC Schottky barrier diode, a Schottky barrier formed by joining an electrode layer to a semiconductor layer can be changed depending on a material such as a metal used in the electrode, and a forward rising voltage and a reverse leakage current change in accordance with the height of the Schottky barrier. One electrode material which increases the height of the Schottky barrier is nickel (Ni). When this material is used as the electrode material, a threshold voltage increases, but the reverse leakage current is suppressed. In contrast, one material which decreases the height of the Schottky barrier is titanium silicide ($TiSi_2$). When this material is used, the height of the Schottky barrier decreases, but the reverse leakage current increases. Thus, the electrode material having a low forward threshold voltage increases the reverse leakage current, and it has been impossible that both the forward threshold voltage and the reverse leakage current are low.

On the other hand, there has been disclosed a structure in which a junction barrier is provided at a Schottky junction so that the reverse leakage current of a Schottky barrier semiconductor device is reduced to increase a reverse breakdown voltage (refer to JP-A 59-35183 [KOKAI]). In this Patent document, the reverse leakage current is reduced to enhance the breakdown voltage by a depletion layer which is formed on the side of a first semiconductor region (2) by a junction barrier (4), as disclosed in FIG. 1 of this document.

As described above, the Schottky barrier using a practical electrode material has the characteristics of the forward threshold voltage and the leakage current corresponding to the electrode material, and it has heretofore been impossible to avoid such reciprocal characteristics. Moreover, if a semiconductor region whose conductivity type is different from that of the above-mentioned SiC semiconductor layer serving as a drift layer is formed on the surface of this semiconductor layer, this region does not function as an operation region, and the work area of the drift layer is reduced. In this case, there is a problem of increased series resistance between the electrode layer and an ohmic electrode provided on the rear surface of an SiC semiconductor substrate. Further, the SiC Schottky barrier semiconductor device is required to ensure operation at a high temperature. Especially when the dependency of the leakage current on the temperature is considered, stronger suppression of the leakage current is needed at the high temperature, and a more advanced technique for suppressing the leakage current is demanded.

In view of the foregoing circumstances, the most satisfactory condition of combination is searched for, and it is then clear that a junction barrier controlled Schottky (JBS) structure can be used which selects a Schottky electrode material having a low work function to reduce an on-voltage and which suppresses the reverse leakage current as a measure against the leakage current. A Schottky electrode material having an excessively low work function has an excessively high reverse leakage current and leads to difficulty in obtaining a diode characteristic as such. However, if the height of the Schottky barrier is 1.2 eV or more, the threshold voltage of a conventional Si-PiN diode having the same breakdown voltage is exceeded. Thus, a sufficient reduction of loss expected by the use of the SiC diode might be impaired. It is necessary that the height of the Schottky barrier be 1 eV or less in order to provide a threshold voltage equal to at least that of the Si-PiN diode.

Thus, it has been desired to realize an SiC Schottky barrier semiconductor device which stably operates without much increase of the reverse leakage current even in the case of a temperature variation.

BRIEF SUMMARY OF THE INVENTION

According to one aspect of the invention, there is provided a semiconductor device which includes:

a semiconductor substrate of a first conductivity type formed of SiC and having a first surface and a second surface;

a semiconductor layer of the first conductivity type formed of SiC and on the first surface of the semiconductor substrate, an impurity concentration of the semiconductor layer being lower than that of the semiconductor substrate;

a first electrode formed on the semiconductor layer and forming a Schottky junction with the semiconductor layer, a barrier height of the Schottky junction being 1 eV or less;

a plurality of junction barriers of a second conductivity type formed to contact the first electrode and each having a depth d1 from an upper surface of the semiconductor layer, a width w, and a space s between adjacent ones of the junction barriers;

an edge termination region of the second conductivity type formed outside the junction barriers to contact the first electrode and having a depth d2 from the upper surface of the semiconductor layer; and a second electrode formed on the second surface of the semiconductor substrate, wherein following relations are satisfied:
d1/d2≧1;
s/d1≦0.6; and
s/(w+s)≦0.33.

BRIEF DESCRIPTION OF THE SEVERAL VIEWS OF THE DRAWINGS

FIG. 3 is another schematic top view of the Schottky barrier semiconductor device according to the first embodiment;

FIG. 4 is a characteristic diagram for explaining a factor to manifest effects of the present invention;

DETAILED DESCRIPTION OF THE INVENTION

Before describing embodiments, there will be described the cause of the above-mentioned problem and effectiveness of its solution which have become apparent by preconditions of the invention or experiments and researches carried out by the present inventors.

Figure 8:
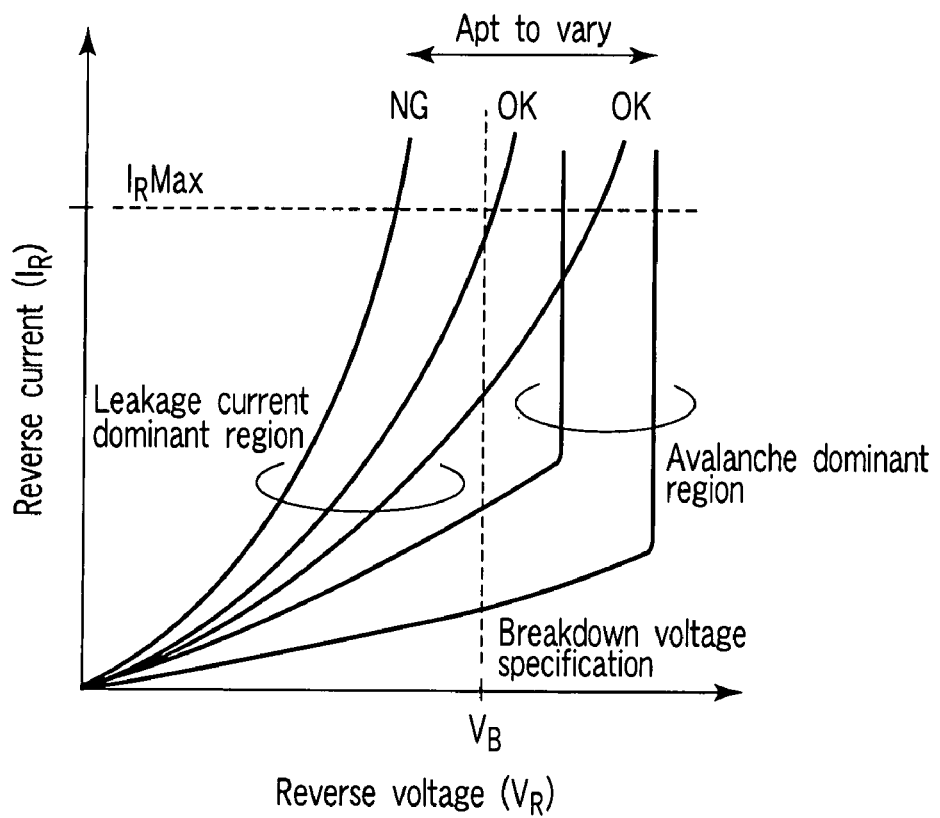
FIG. 8 is a characteristic diagram for explaining a leakage current dominant region and an avalanche dominant region.

In general, as shown in FIG. 8, the value of a reverse current (Irmax) or the rated current running when a bias is applied in a reverse direction is predetermined, and the value of a voltage reaching the predetermine value is set as the breakdown voltage of a diode or the rated maximum breakdown voltage ($V_B$). In the case of a PiN diode, a breakdown voltage (avalanche voltage) is a voltage at which a current generated by avalanche multiplication after the application of a reverse bias to a p/n junction and the generation of a carrier from a depletion layer exceeds the predetermined value of the reverse current. This breakdown voltage is determined by the concentration and thickness of a drift layer. Such a breakdown voltage characteristic is called avalanche dominance.

On the other hand, when the reverse bias is applied to a Schottky barrier diode, a leakage current from a Schottky electrode increases due to an electric field applied to the electrode, and the reverse current increases before the avalanche voltage is reached. When the predetermined value of the reverse current is exceeded, the voltage at that point is the breakdown voltage. Thus, there may be a situation where the breakdown voltage of the diode is lower than the breakdown voltage determined by avalanche, and such a breakdown voltage characteristic is called leakage current dominance.

In an SiC Schottky junction semiconductor device, on-resistance has to be low, and a predetermined reverse breakdown voltage ($V_B$) has to be satisfied. It has become apparent from the results of the researches that a fault often occurs where a reverse leakage current deviates from a standard value when $TiSi_2$ which brings the height of a Schottky barrier to 0.9 eV is used for a Schottky electrode material in order to decrease the on-resistance. This is due to the fact that the reverse current (leakage current) at the predetermined reverse current measured voltage ($V_B$) has a higher probability of greatly varying and failing to meet the standards if the rising edge of the reverse current is softer in a reverse voltage-reverse current characteristic, as shown in FIG. 8.

Figure 1:
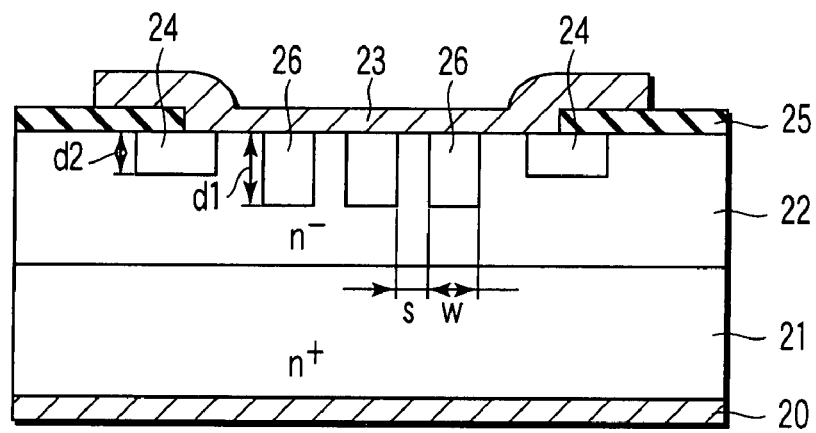
FIG. 1 is a sectional view of a Schottky barrier semiconductor device according to a first embodiment.

Therefore, the relation between a device structure and electric properties was examined using a device simulator. A diode having a plurality of junction barriers at a Schottky interface as shown in FIG. 1 was targeted as the device structure. That is, this structure is provided with a plurality of p-type semiconductor regions (junction barriers) 26 in an n-type semiconductor region 22, and a reference numeral 24 denotes a p-type edge termination region. In such a structure, it became apparent from the result of a calculation that a reverse breakdown voltage made a great change of ±200 V when a size s between the adjacent junction barriers fluctuated at ±0.1 μm. Conditions of the calculation at this point included 0.65 μm which was a center value of the size s between the adjacent p-type semiconductor regions 26 in FIG. 1, 0.5 μm which was a width w of the p-type semiconductor region 26, 0.6 μm which was a depth d1, and $1.0×10^{16}$/$cm^3$ which was the impurity concentration of the drift layer. At this point, the density of a rated leakage current was 6 $mA/cm^2$, and a voltage at which the density of the reverse leakage current reached this value was defined as a breakdown voltage. When the reverse voltage-reverse current characteristic was checked, the reverse current rose softly, and the breakdown voltage was determined by the leakage current. In the experiment for the reverse voltage-reverse current characteristic of an actual device as well, no avalanche current was observed, and the rated leakage current was always exceeded by the leakage current.

Figure 5:
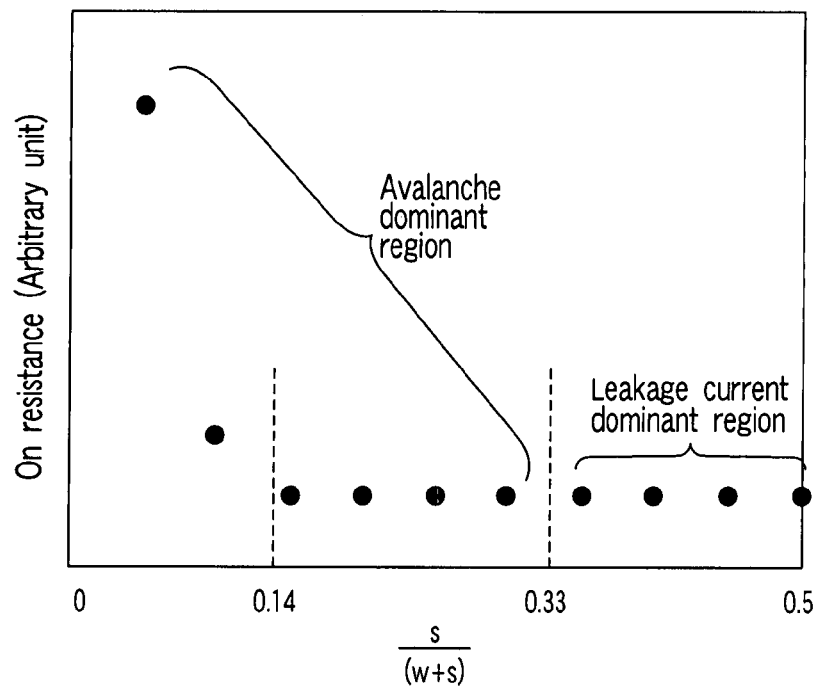
FIG. 5 is another characteristic diagram for explaining a factor to manifest the effects of the present invention.

On the other hand, the value of s/(w+s) is 0.33 or less and a ratio (d1/d2) between the depth d1 of the p-type semiconductor region 26 and the depth d2 of the edge termination region is about 1 or more, where w is the width of the p-type semiconductor region 26 in FIG. 1, and s is the space between the adjacent p-type semiconductor regions 26. In this case, it has been found out that, if, as shown in FIG. 4, the ratio (s/d1) of the space s between the adjacent p-type semiconductor regions 26 to the depth d1 is 0.6 or less, a breakdown rapidly occurs together with avalanche, and a current beyond a rated leakage current of 6 $mA/cm^2$ is generated by avalanche domination. Here, the relation between the value of s/(w+s) and the on-resistance is shown in FIG. 5. Avalanche dominates at 0.33 or less, and a low on-resistance can be achieved at 0.14 or more.

It has also found out that, when the depth d1 of the p-type semiconductor region 26 is about the same as the depth d2 of the edge termination region 24 (d1/d2≅1), the space s between the adjacent p-type semiconductor regions 26 has to be significantly small in order to achieve the reverse voltage-reverse current characteristic in which the breakdown voltage is determined by an avalanche current, resulting in a considerable increase of the on-resistance.

More specifically, there is concern about the increase of the on-resistance when the space between the adjacent p-type semiconductor regions 26 is 1 μm or less. Thus, it has been confirmed by a separately conducted experiment that the increase of the on-resistance can be held down to a negligible level when nitrogen is ion-implanted into the space between the adjacent p-type semiconductor regions 26 to increase the impurity concentration to $1.2×10^{16}$/$cm^3$ which is 20% higher than that of the drift layer. It has not been recognized within the scope of the experiments by the present inventors how the breakdown voltage in the avalanche dominant region decreases due to an increase of the carrier concentration in the space between the adjacent p-type semiconductor regions.

It has been ascertained by a calculation similar to that described above that the employment of the structure in which the breakdown voltage is determined by the avalanche domination limits the reverse breakdown voltage to a small change of ±20 V even if the space between the adjacent p-type semiconductor regions 26 shown in FIG. 1 fluctuates at ±0.1 μm.

There has also been obtained a calculation result showing that the temperature dependency of the avalanche current is much smaller than the temperature dependency of the leakage current, and it has also been found out that the employment of the structure in which the breakdown voltage is determined by the avalanche domination can ensure stable operation even at a high temperature.

Hereinafter, details of the present invention will be described in connection with the illustrated embodiments. It is to be noted that a first conductivity type is an n type and a second conductivity type is a p type in the following embodiments.

First Embodiment

FIG. 1 is a schematic sectional view showing the basic configuration of a semiconductor device according to a first embodiment of the present invention. As shown in FIG. 1, a homoepitaxially grown n⁻-type drift layer 22 having a carrier concentration of 5 to $8 \times 10^{15}/cm^3$ and a thickness of about 8 μm is first formed on a low-resistance n⁺-type SiC substrate 21, which is formed of SiC having a polytype of 4H, and then an ohmic electrode 20 is formed on the rear surface of the substrate 21.

Junction barriers 26 into which Al ions are selectively implanted are formed in a central region of the surface of the drift layer 22 at a depth of d1=1.1 μm. As shown in a top view (note that an electrode 23 described later is omitted) in FIG. 2, a plurality of oblong junction barriers 26 are arranged at a width w of 1.3 μm and a space s of 0.6 μm. The junction barriers 26 can also be island-like as shown in FIG. 3. Then, an edge termination region 24 in which Al ions are selectively implanted is formed in a peripheral region of the surface of the drift layer 22 at a depth of d2=0.6 μm to surround the plurality of junction barriers 26.

In order to activate the implanted ions, annealing is carried out in an Ar atmosphere at 1600° C. for five minutes, and then the dimensions of a produced structure are checked against requisites shown in FIGS. 4 and 5. First, the depth (d1=1.1 μm) of the junction barrier 26 is greater than the depth (d2=0.6 μm) of the edge termination region 24, that is, the value of the vertical axis (the depth d1 of the junction barrier/the depth d2 of the edge termination region) in FIG. 4 is 1.8. Then, the space (s=0.6 μm) between the adjacent junction barriers 26 is divided by the depth (d1=1.1 μm) of the junction barrier 26, resulting in a value of 0.545 which can be recognized as a value lower than 0.6. Further, the relation (s/(w+s)) between the width (w=1.3 μm) of the junction barrier 26 and the space (s=0.6 μm) between the adjacent junction barriers 26 is 0.32, which can be recognized as a value lower than 0.33. Moreover, as apparent from FIG. 5, this value is larger than 0.14 and can therefore be also recognized to be in the region with no likelihood of the increase of the on-resistance.

A field oxide film 25 is formed by patterning with an oxide film deposited by CVD after dry oxidation. After contact holes for forming Schottky junctions are formed, TiSi₂ is formed as the Schottky electrode 23 by sputtering. A pad electrode (not shown) is formed on the Schottky electrode 23, such that an SiC Schottky barrier diode is completed.

When the Schottky barrier diodes manufactured as described above were inspected, nondefective products could be obtained at a yield of over 85%. Moreover, when a breakdown voltage was measured in a state heated to 150° C. in the measurement of reverse electric properties, the density of the leakage current was 6 mA/cm² or less even if a voltage was applied up to a predetermined level of 1200 V. An avalanche current was observed when the voltage was further increased to 1300 V.

Second Embodiment

Figure 6:
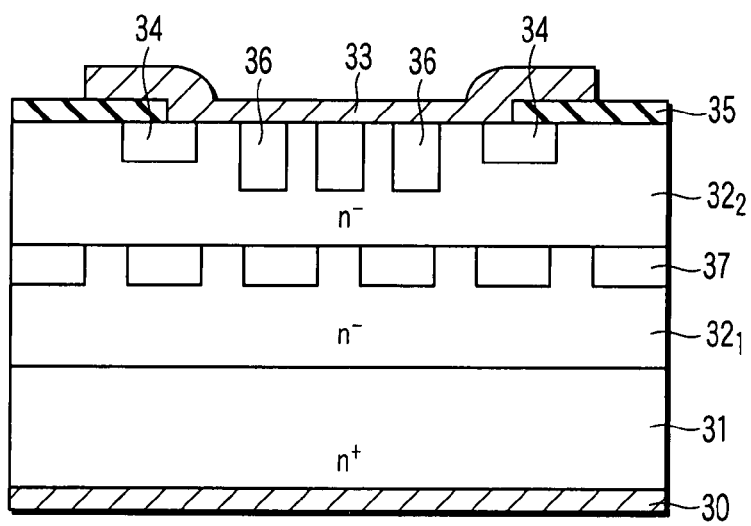
FIG. 6 is a sectional view of a Schottky barrier semiconductor device according to a second embodiment.

FIG. 6 is a schematic sectional view showing the basic configuration of a semiconductor device according to a second embodiment. As shown in FIG. 6, a homoepitaxially grown n⁻-type first drift layer 32₁ is first formed on a low-resistance n⁺-type SiC substrate 31 so that its carrier concentration may be about 0.7 to $1 \times 10^{16}/cm^3$ and its thickness may be 10 μm, and then selective Al ion implantation is carried out to form a plurality of p-type embedded layers 37. The p-type embedded layers 37 can be stripe-like as in FIG. 2 or island-like as in FIG. 3. Further, after forming a second drift layer 32₂ having the same carrier concentration and thickness as those of the above-mentioned homoepitaxially grown n⁻-type first drift layer 32₁, an ohmic electrode 30 is formed on the rear surface of the substrate 31.

Subsequently, junction barriers 36 into which Al ions are selectively implanted are formed in a central region of the surface of the second drift layer 32₂ at a depth of 1.1 μm. A plurality of oblong junction barriers 36 are arranged at a width w of 1.3 μm and a space s of 0.6 μm. The junction barriers 36 may be in the form of a plurality of islands as in the first embodiment. Then, Al ions are selectively implanted into a peripheral region of the surface of the second drift layer 32₂ to surround the plurality of junction barriers 36, such that an edge termination region 34 is formed at a depth of d2=0.6 μm.

In order to activate the implanted ions, annealing is carried out in an Ar atmosphere at 1600° C. for five minutes, and then the dimensions of a produced structure are checked against requisites shown in FIGS. 4 and 5. First, the depth (d1=1.1 μm) of the junction barrier 36 is greater than the depth (d2=0.6 μm) of the edge termination region 34, that is, the value of the vertical axis (the depth d1 of the junction barrier/the depth d2 of the edge termination region) in FIG. 1 is 1.8. Then, the space (s=0.6 μm) between the adjacent junction barriers 36 is divided by the depth (d1=1.1 μm) of the junction barrier 36, resulting in a value of 0.545 which can be recognized as a value lower than 0.6. Further, the relation (s/(w+s)) between the width (w=1.3 μm) of the junction barrier 36 and the space (s=0.6 μm) between the adjacent junction barriers 36 is 0.32, which can be recognized as a value lower than 0.33. Moreover, as apparent from FIG. 5, this value is larger than 0.14 and can therefore be also recognized to be in the region with no likelihood of the increase of the on-resistance.

Then, a field oxide film 35 is formed by patterning with an oxide film deposited by CVD after dry oxidation. After contact holes for forming Schottky junctions are formed, TiSi₂ is formed as a Schottky electrode 33 by sputtering. A pad electrode (not shown) is formed on the Schottky electrode 33, such that an SiC Schottky barrier diode is completed.

When the Schottky barrier diodes manufactured as described above were inspected, nondefective products could be obtained at a yield of over 85%. Moreover, when a breakdown voltage was measured in a state heated to 150° C. in the measurement of reverse electric properties, the density of the leakage current was 6 mA/cm² or less even if a voltage was applied up to a predetermined level of 2400 V. An avalanche current was observed when the voltage was further increased to 2600 V.

As described above, effects similar to those in the first embodiment can also be provided by a Super Schottky barrier diode (Super-SBD) having the plurality of p-type embedded layers 37.

Third Embodiment

Figure 7:
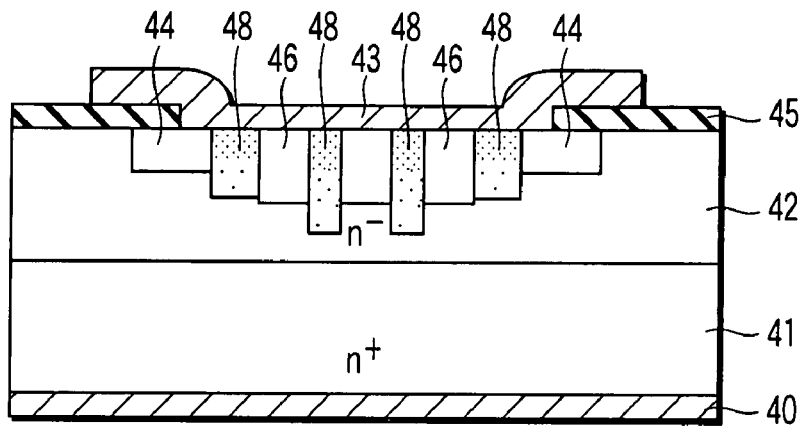
FIG. 7 is a sectional view of a Schottky barrier semiconductor device according to a third embodiment.

FIG. 7 is a schematic sectional view showing the basic configuration of a semiconductor device according to a third embodiment. As shown in FIG. 7, a homoepitaxially grown n⁻-type drift layer 42 is first formed on a low-resistance n⁺-type SiC substrate 41 such that its carrier concentration is about 5 to $8 \times 10^{15}/cm^3$ and its thickness is 8 μm, and then an ohmic electrode 40 is formed on the rear surface of the SiC substrate 41.

Subsequently, junction barriers 46 into which Al ions are selectively implanted are formed in a central region of the surface of the drift layer 42 at a depth of d1=1.1 μm. A plurality of junction barriers 46 are arranged in a striped configuration at a width w of 1.3 μm and a space s of 0.6 μm. The junction barriers 46 may be island-like as in FIG. 3.

Then, an edge termination region 44 in which Al ions are selectively implanted is formed beside a peripheral region of the surface of the drift layer 42 at a depth of D2=0.6 μm. This time, nitrogen (N) is ion-implanted into a part 48 between the adjacent junction barriers 46 so that its average volume density is $3 \times 10^{16}/cm^3$.

Figure 2:
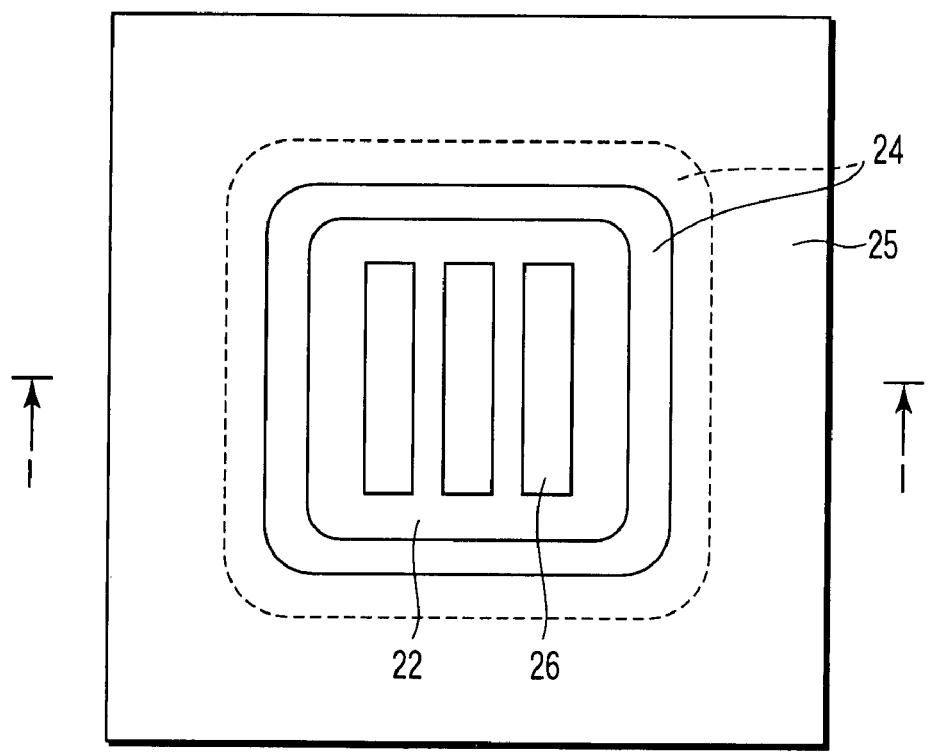
FIG. 2 is a schematic top view of the Schottky barrier semiconductor device according to the first embodiment without an anode electrode.

In order to activate the implanted ions, annealing is carried out in an Ar atmosphere at 1600° C. for five minutes, and then the dimensions of a produced structure are checked against requisites shown in FIGS. 1 and 2. First, the depth (d1=1.1 μm) of the junction barrier 46 is greater than the depth (d2=0.6 μm) of the edge termination region 44, that is, the value of the vertical axis (the depth d1 of the junction barrier/the depth d2 of the edge termination region) in FIG. 4 is 1.8. Then, the space (s=0.6 μm) between the adjacent junction barriers 46 is divided by the depth (d1=1.1 μm) of the junction barrier 46, resulting in a value of 0.545 which can be recognized as a value lower than 0.6. Further, the relation (s/(w+s)) between the width (w=1.3 μm) of the junction barrier 46 and the space (s=0.6 μm) between the adjacent junction barriers 46 is 0.32, which can be recognized as a value lower than 0.33. Moreover, as apparent from FIG. 5, this value is larger than 0.14 and can therefore be also recognized to be in the region with no likelihood of the increase of the on-resistance.

Then, a field oxide film 45 is formed by patterning with an oxide film deposited by CVD after dry oxidation. After contact holes for forming Schottky junctions are formed, $TiSi_2$ is formed as a Schottky electrode 43 by sputtering. A pad electrode (not shown) is formed on the Schottky electrode 43, such that an SiC Schottky barrier diode is completed.

When the Schottky barrier diodes manufactured as described above were inspected, nondefective products could be obtained at a yield of over 85%. Moreover, when a breakdown voltage was measured in a state heated to 150° C. in the measurement of reverse electric properties, the leakage current was 6 mA/cm² or less even if a voltage was applied up to a predetermined level of 1200 V. An avalanche current was observed when the voltage was further increased to 1300 V. Further, when ions were implanted into the part 48 between the adjacent junction barriers 46, the on-resistance decreased, providing effects as expected. In addition, no collateral adverse effects were observed, such as the increase of the leakage current as reverse characteristics.

Thus, in addition to the effects in the first embodiment, according to the third embodiment, nitrogen is ion-implanted into the space between the adjacent p-type semiconductor regions so that the impurity concentration is 20% higher than that of the drift layer, thereby making it possible to hold down the increase of the on-resistance to a negligible level.

According to the present invention, it is possible to provide an SiC Schottky barrier semiconductor device which stably operates without much increase of the reverse leakage current even in the case of a temperature variation.

In addition, the present invention is not limited to the embodiments described above. While the first conductivity type is the n type and the second conductivity type is the p type in the embodiments, similar effects can also be obtained when the first conductivity type is the p type and the second conductivity type is the n type. Moreover, the Schottky barrier diode has been described as an example of a semiconductor device in the embodiments of the present invention, but the present invention can also be applied to the formation of other semiconductor devices, in which case similar effects can be obtained. $TiSi_2$ has been described as an example of the Schottky electrode material, but the Schottky electrode material may be a metal material or a chemical compound material such that the height of the Schottky barrier is 1 eV or less, and the material can be suitably changed and used.

Furthermore, the diode having a breakdown voltage as high as 1200 V has been described as an example of the SiC Schottky barrier diode, but it can be properly changed depending on the specification of the breakdown voltage of the diode.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type formed of SiC and having a first surface and a second surface;
   a semiconductor layer of the first conductivity type formed of SiC and on the first surface of the semiconductor substrate, an impurity concentration of the semiconductor layer being lower than that of the semiconductor substrate;
   a first electrode formed on the semiconductor layer and forming a Schottky junction with the semiconductor layer, a barrier height of the Schottky junction being 1 eV or less;
   a plurality of junction barriers of a second conductivity type formed to contact the first electrode and each having a depth d1 from an upper surface of the semiconductor layer, a width w, and a space s between adjacent ones of the junction barriers;
   an edge termination region of the second conductivity type formed outside the junction barriers to contact the first electrode and having a depth d2 from the upper surface of the semiconductor layer; and
   a second electrode formed on the second surface of the semiconductor substrate,
   wherein following relations are satisfied:

$d1/d2 \geq 1$;

$s/d1 \leq 0.6$; and $s/(w+s) \leq 0.33$.

2. The device according to claim 1, wherein a following relation is further satisfied between the width w and the space s, $0.14 \leq s/(w+s)$.

3. The device according to claim 1, wherein each of the plurality of junction barriers is formed as an island configuration or a striped configuration.

4. The device according to claim 1, wherein the Schottky junction between the semiconductor layer and the first electrode configures a Schottky diode.

5. The device according to claim 1, wherein the first electrode contains $TiSi_2$.

6. The device according to claim 1, further comprising a plurality of embedded regions of the second conductivity type in the semiconductor layer.

7. The device according to claim 6, wherein each of the plurality of embedded regions is formed as an island configuration or a striped configuration.

8. The device according to claim 1, further comprising highly doped regions of the first conductivity type formed in the semiconductor layer between the junction barriers and each having an impurity concentration higher than that of the semiconductor layer.

9. The device according to claim 1, wherein the semiconductor substrate is formed of SiC having a crystal polytype of 4H.

10. A semiconductor device comprising:
a semiconductor substrate of a first conductivity type formed of SiC and having a first surface and a second surface;
a semiconductor layer of the first conductivity type formed of SiC and on the first surface of the SiC semiconductor substrate, impurity concentration of the semiconductor layer being lower than that of the semiconductor substrate;
a first electrode formed on the semiconductor layer and forming a Schottky junction with the semiconductor layer, a barrier height of the Schottky junction being 1 eV or less;
a plurality of junction barriers of a second conductivity type formed in the semiconductor layer to contact the first electrode;
an edge termination region of the second conductivity type formed in the semiconductor layer outside the junction barriers to contact the first electrode; and
a second electrode formed on the second surface of the semiconductor substrate,
wherein the junction barriers are formed such that a leakage current generated when a reverse voltage is applied up to a rated maximum breakdown voltage is less than a rated current value at a working maximum temperature and such that a main mechanism which generates a reverse current exceeding the rated current provides avalanche when the reverse voltage applied is increased to be equal to or more than the rated maximum breakdown voltage.

11. The device according to claim 10, wherein a depth and a width of each of the plurality of junction barriers from the first surface of the semiconductor layer is d1 and w, respectively, a space between adjacent ones of the junction barriers is s, and a depth of the edge termination region from an upper surface of the semiconductor layer is d2, following relations are satisfied:

$$d1/d2 \geq 1;$$

$$s/d1 \leq 0.6; \text{ and}$$

$$s/(w+s) \leq 0.33.$$

12. The device according to claim 11, wherein a following relation is further satisfied between the width w and the space s, $$0.14 \leq s/(w+s).$$

13. The device according to claim 10, wherein each of the plurality of junction barriers is formed as an island configuration or a striped configuration.

14. The device according to claim 10, wherein the Schottky junction between the semiconductor layer and the first electrode configures a Schottky diode.

15. The device according to claim 10, wherein the first electrode contains $TiSi_2$.

16. The device according to claim 10, further comprising a plurality of embedded regions of the second conductivity type formed in the semiconductor layer.

17. The device according to claim 16, wherein each of the plurality of embedded regions is formed as an island configuration or a striped configuration.

18. The device according to claim 10, further comprising highly doped regions of the first conductivity type in the semiconductor layer between the junction barriers and each having an impurity concentration higher than that of the semiconductor layer.

19. The device according to claim 10, wherein the semiconductor substrate is formed of SiC having a crystal polytype of 4H.

* * * * *